United States Patent [19]
Howley et al.

[11] 4,034,356
[45] July 5, 1977

[54] RECONFIGURABLE LOGIC ARRAY

[75] Inventors: Frank E. Howley, Poughkeepsie, N.Y.; John W. Jones, Winchester, England; Joseph C. Logue, Poughkeepsie, N.Y.

[73] Assignee: IBM Corporation, Armonk, N.Y.

[22] Filed: Dec. 3, 1975

[21] Appl. No.: 637,261

[52] U.S. Cl. .............................. 340/173 R; 307/269
[51] Int. Cl.² ......................................... G11C 11/36
[58] Field of Search ................ 340/173 R; 307/238, 307/279, 269, 112

[56] References Cited
UNITED STATES PATENTS
2,855,540  10/1958  Hoover .......................... 340/173 R

*Primary Examiner*—Terrell W. Fears
*Attorney, Agent, or Firm*—James E. Murray

[57] ABSTRACT

This specification describes a set of arrays for performing logic function in various subsets of the original set. The array structure is characterized by a plurality of arrays joined together with a bidirectional bussing system. This bussing system comprises addressing lines of the arrays joined together by switching circuitry used to regroup the set into subsets as necessary to perform the logic functions.

2 Claims, 3 Drawing Figures

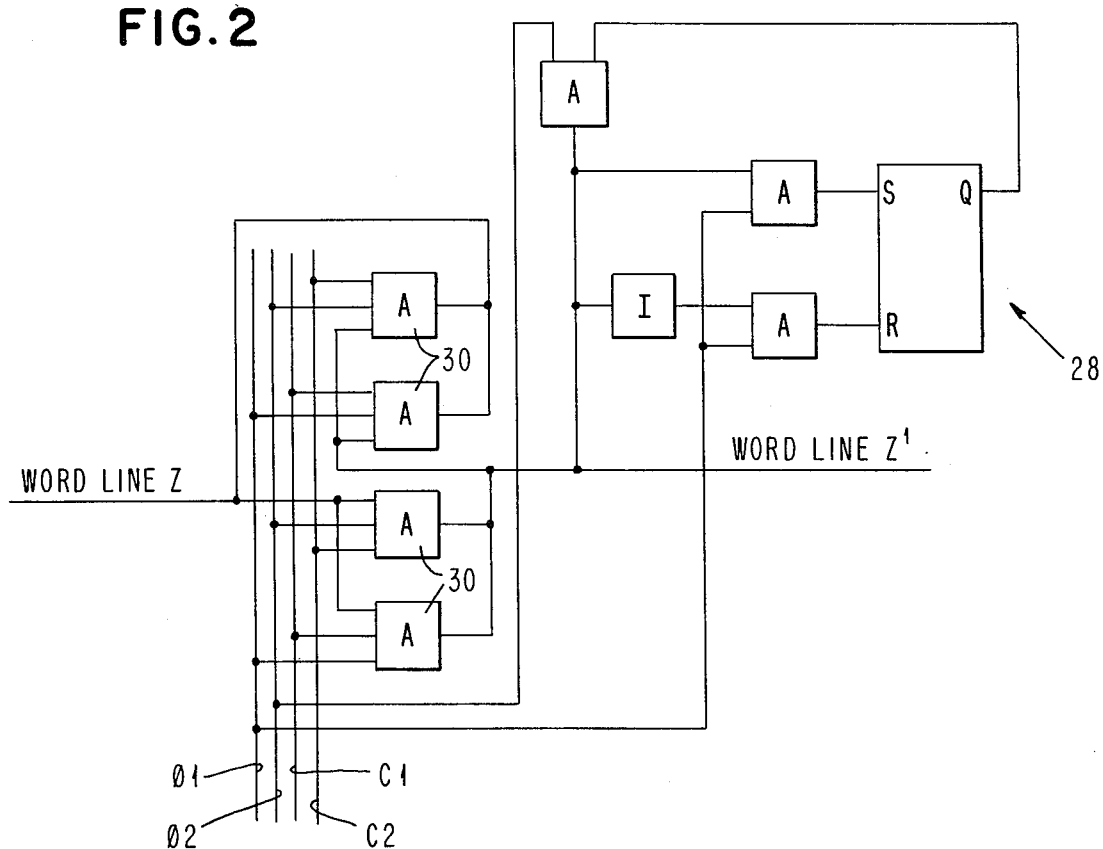

RECONFIGURABLE LOGIC ARRAY

BACKGROUND OF THE INVENTION

The present invention relates to reconfigurable arrays for performing logic functions.

Performing of logic in matrices of identical circuit elements each located in a unique intersection of an input and output line in a grid of intersecting input and output lines is well known. It is also well known that standardization of logic circuit elements stemming from the use of a logic matrices or arrays results in the simplification and acceleration of the design and manufacturing of monolithic chips containing logic performing circuits. However, up until now the use of the logic arrays has been limited. A major cause of this limited use has been that only a small percentage of the intersections in an array turn out to be usable in performing logic functions. This percentage of useful intersections in the arrays results in inefficient use of the surface area of the monolithic chips on which the arrays are fabricated. It turns out, that for most applications, the design and manufacturing efficiencies of logic arrays are outweighed economically by their inefficient use of chip area and it is less expensive to spend additional time and effort to design and manufacture logic chips with highly customized layouts that are less orderly than logic arrays but perform for more logic functions in a given area of a monolithic chip.

The small percentage of usable logic circuits in a logic array is a result of the orderliness of the array. Once input and output lines are used to perform a given logic function they cannot be used in performing other unrelated logic functions without hopelessly muddling the logic. As a result, large areas of the array contain intersections of input and output lines that are barren of usable circuits.

A number of schemes have been devised to reduce the sparseness of the logic on logic array chips. One such scheme is to use a plurality of decoders to feed input variables to the input lines of a single array allowing a number of very powerful logic functions to be efficiently performed in a single array. Another scheme used to reduce sparseness involves using compound arrangement of arrays called programmable array logic chips (PLA's). Thes involve feeding the output of a first array called a product term generator, or an AND array, to a second array called the sum of a product term generator, or an OR array, so as to increase the number of functions that can be performed without geometrically increasing the number of array intersections needed to perform those functions. While these modifications increase the number of useful logic circuits that can be placed in an array logic chip, they do not solve the problem of the unusable portions of the input and output lines that is discussed above.

To reduce the unusable portions, it has been suggested that the arrays be divided into portions, such as is shown in the Gardner, et al, U.S. Pat. No 3,504,351 and the Cox et al U.S. Pat application Ser. No. 537,219 filed 12/30/74, to permit the simultaneous performance of two or more logic functions on the same lines of the array. It has also been suggested that instead of having a single array configuration a plurality of arrays be formed on a chip and these arrays be joined by a crosspoint switch interconnection scheme which can be broken to isolate groups of the arrays performing different functions. While full interconnection of the arrays by a standardized crosspoint switching scheme provides significant flexibility in laying out the arrays, it generally is not justified because of power requirements, increased probability of defects, and final cost.

THE INVENTION

Therefore in accordance with the present invention a new array interconnection scheme is provided. This scheme is characterized by having a string of AND/OR array groups with their addressing lines interconnected along one coordinate axis of each array. Each group of arrays is separated from other groups by logic circuitry which enables the connecting and disconnecting of the groups into various combinations needed to perform the desired logic functions.

Therefore it is an object of the present invention to provide a new reconfigurable array logic structure.

It is another object of the present invention to provide a reconfigurable array logic structure which will permit connection of groupings without a complete matrix arrangement.

It is another object of the invention to provide reconfigurable array structure which has the ability to bypass defects, permit various interconnections of arrays in sets and subsets and/or enable greater use of the circuits in the array.

THE DRAWINGS

These and other objects of the invention will be apparent from the following more particular description of the preferred embodiments of the invention of which:

FIG. 2 is a circuit diagram for the latching and interconnecting circuits shown in FIG. 1;

FIG. 3 is a timing chart for the signals supplied to the AND gates in FIG. 2.

DETAILED DESCRIPTION

Figure 1:
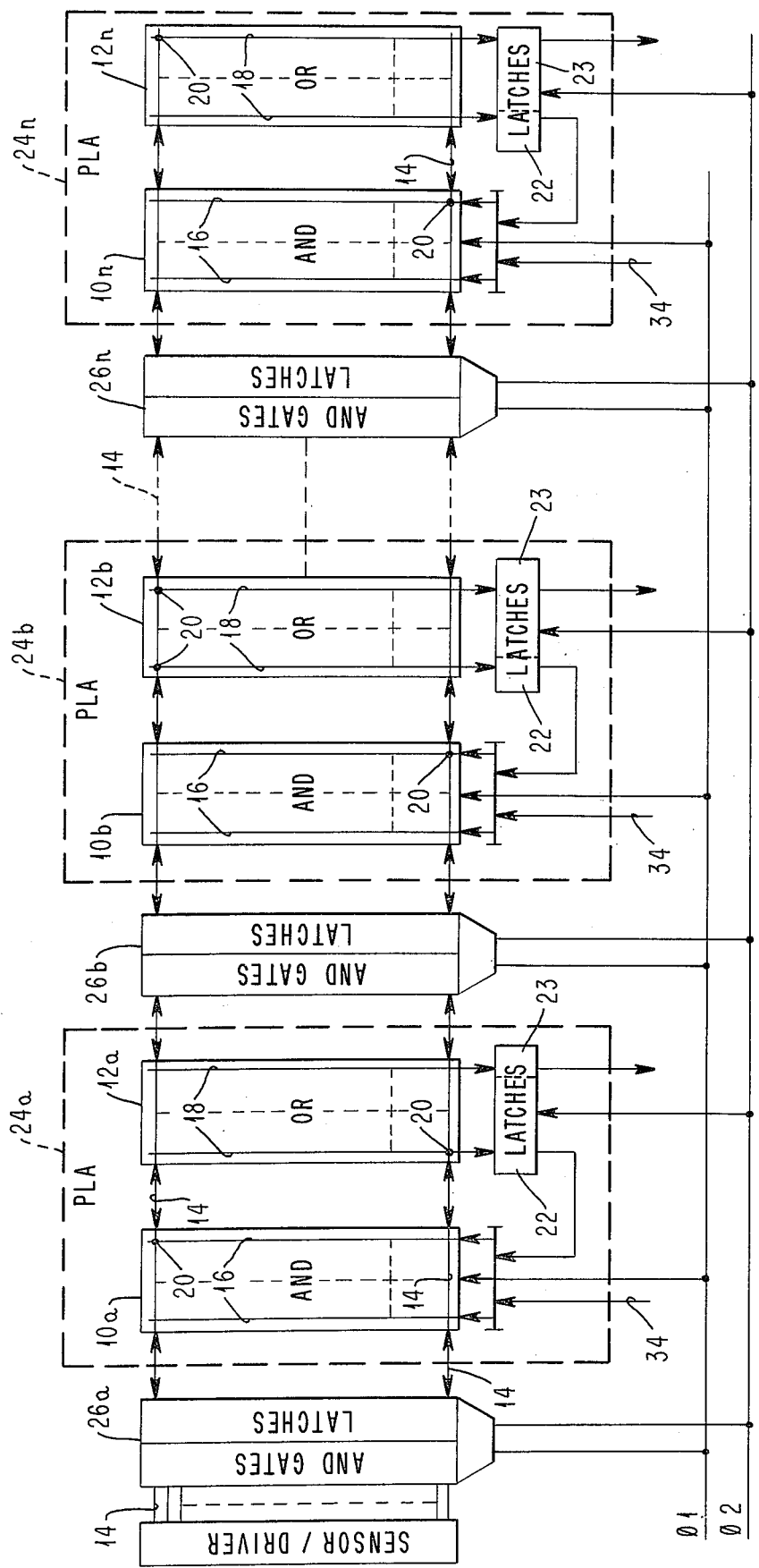
FIG. 1 is a diagram of plurality of AND/OR arrays arranged in accordance with the present invention.

Referring now to FIG. 1, plurality of groupings of AND and OR arrays 10 and 12 are joined together by common word lines 14. These word lines 14 are each intersected by a plurality of bit lines 16 and 18 in the AND and OR arrays 10 and 12 respectively. At certain intersections of the word lines 14 with bit lines 16 and 18 are logic performing elements 20 that will perform a logical operation. In the case of the AND arrays it is an AND circuit which performs and AND operation on data placed on the bit lines 16 and provides the resultant on the word lines 14. In the case of the OR arrays 12 it is an OR operation on data on the word lines 14 and the resultant of this OR operation is placed on the bit lines 18.

At the end of each bit line 18 there is a latch 22 to retain the resultant of operations performed in the AND and OR arrays. From the latch 22, the signals can be fed back into the AND array to perform sequential logic or taken off the chip for further operations on other chips. The latches 22 are arranged as a shift register 23 so that external data can be shifted into the first stage of any string of latches and moved from latch to latch and out the last stage of the string. This arrangement of latches and AND and OR arrays for performing combinational and sequential logic is called a programmable logic array or PLA 24. Such PLA's are well known and their construction and operation are fully described in the above mentioned Cox et al application. It is also well known that the operation of the PLA's can be controlled by clocking signals $\phi1$ and $\phi2$ so that the AND array 10 is energized by the $\phi1$ signal during a first clock period while the latches 22 are energized by the $\phi2$ signal to latch up only during a succeeding clock period.

Along each work line 14 and between each PLA 24 is control circuitry 26 that controls the passing of signals along the word lines 14 between the various PLA's. As shown in FIG. 2, for each word line 14 this control circuitry 26 comprises a latch 28 and four AND circuits 30. The latch 28 retains information that is placed on the word line when the first or $\phi1$ clock signal is up and will maintain that information until the data is read out onto the word line 14 by the second or $\phi2$ clock signal. The AND circuits 30 inhibit or enable the transmission of signals along the word line 14 in either direction between PLA's during either time period as determined by the combinations of control signals C1 and C2 and clock signals $\phi1$ and $\phi2$ shown in the truth table of FIG. 3. Thus logic functions can be performed in a single PLA 24 or different combinations of those PLA's 24. Furthermore the combinations of PLA's can be different during the $\phi1$ and $\phi2$ clock periods so that more than one combination of PLA's can be used in performing a logic function.

To perform a logical operation using the reconfigurable logic array, interrogation or input signals 34 are fed into the input of the AND arrays 10 during the $\phi1$ clock period and an operation is performed on them in the AND arrays 10 and the resultant latched in the latches 28. During this period of time the PLA's may or may not be interconnected by the AND gates 30 along the word lines 14 so that the results of ANDing in one AND array may be latched up in one or more of the sets of latches 28. During the $\phi2$ clock period, the latches 22 are set to store the results of the OR operation in the OR arrays 12 on the data stored in the latches 28. The information stored in the latches 22 can be read out of the latches and off the reconfigurable array chip during the next succeeding $\phi1$ clock period and/or it can be fed back into the AND array to be used to perform the next logical function. Again during $\phi2$ clock period the PLA's may or may not be connected by the AND gates 30 along word lines 14. Therefore, interconnection of arrays can be made and/or changed during either $\phi1$ or $\phi2$ providing differing array interconnections during the two phases of the PLA operating cycle.

An example of this interconnection variability would be to have the word line 14a of PLA's 24a and 24b coupled together to provide a two array wide AND circuit. During the succeeding $\phi2$ clock time the results of this wide ANDing can be propagated to the right. Capabilities for wide ANDing and subsequent bi-directional ORing are shown in the truth table of FIG. 3.

While the invention has been particularly shown and described with reference to a preferred embodiment thereof, it will be understood by those skilled in the art that the above and other changes in form and details may be made therein without departing from the spirit and scope of the invention

What is claimed is:

1. A reconfigurable logic array comprising:
   a plurality of programmable logic arrays made up of latches and sets of AND and OR arrays having common addressing lines that extend through all sets of arrays with inputs supplied to the AND arrays on lines transverse to said common addressing lines and the latches coupled to the outputs of the OR arrays on lines transverse to said common addressing lines;
   gating means along the common address lines between the sets for controlling the passage of signals between sets;
   latching means on said addressing lines between the sets for storing bits of data transmitted along said addressing line; and
   clocking means for opening and closing said gating means at different time periods whereby the sets of AND and OR arrays can be connected and disconnected as necessary to perform logic functions.

2. A reconfigurable array according to claim 1 including means for supplying input signals to AND arrays during a first one of said time periods;
   means including said latching means for storing the results of said supplies of signals in said latching means;
   and means including said latches for storing the results in the latches during a second one of said time periods.

* * * * *